United States Patent
Ramiah et al.

(10) Patent No.: US 6,345,589 B1
(45) Date of Patent: *Feb. 12, 2002

(54) METHOD AND APPARATUS FOR FORMING A BOROPHOSPHOSILICATE FILM

(75) Inventors: Chandrasekaram Ramiah, Phoenix, AZ (US); Jeffrey L. Young, Los Gatos, CA (US); Neil L. Pagel, Prescott, AZ (US)

(73) Assignees: Applied Materials, Inc., Santa Clara, CA (US); Motorola, Inc., Scottsdale, AZ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/148,436

(22) Filed: Sep. 4, 1998

Related U.S. Application Data

(62) Division of application No. 08/625,668, filed on Mar. 29, 1996, now abandoned.

(51) Int. Cl.⁷ .............................................. C23C 16/00
(52) U.S. Cl. ............................... 118/723 E; 118/723 R
(58) Field of Search ..................... 118/723 R, 723 E, 118/723 ER, 723 MW, 723 MR, 723 MA, 723 ME, 723 I, 723 IR, 723 AN; 156/345; 427/579, 563, 564; 438/784, 788, 792

(56) References Cited

U.S. PATENT DOCUMENTS

| | | | |
|---|---|---|---|
| 4,394,401 A | 7/1983 | Shioya et al. | 427/39 |
| 4,539,068 A | 9/1985 | Takagi et al. | 156/614 |
| 4,837,185 A | 6/1989 | Yau et al. | 437/228 |
| 4,857,160 A | * 8/1989 | Landau et al. | 204/192.12 |
| 4,892,753 A | 1/1990 | Wang et al. | 427/38 |
| 5,040,046 A | 8/1991 | Chhabra et al. | 357/54 |
| 5,356,722 A | 10/1994 | Nguyen et al. | 427/569 |
| 5,409,743 A | 4/1995 | Bouffard et al. | 427/579 |
| 5,508,067 A | 4/1996 | Sato et al. | 427/579 |
| 5,648,175 A | * 7/1997 | Russell et al. | 428/472.3 |

* cited by examiner

Primary Examiner—Gregory Mills
Assistant Examiner—Luz Alejandro
(74) Attorney, Agent, or Firm—Townsend, Townsend & Crew

(57) ABSTRACT

A method and apparatus for improving film stability and moisture resistance of a borophosphosilicate film. The BPSG film according to the present invention is formed under plasma conditions in which high and low frequency RF power is employed to generate the plasma. The high frequency power supply provides most of the energy to break the molecules in the process gas thereby forming the plasma and promoting the necessary reactions. The low frequency power supply regulates and controls ion bombardment of the BPSG film as it is formed. In a preferred embodiment, nitrogen is included in the process gas and the low frequency RF power supply is used to precisely control ion bombardment during deposition processing thereby allowing incorporation of an unexpectedly elevated amount of nitrogen into the film further improving film stability.

20 Claims, 6 Drawing Sheets

METHOD AND APPARATUS FOR FORMING A BOROPHOSPHOSILICATE FILM

This application is a division of and claims the benefit of U.S. application Ser. No. 08/625,668, filed Mar. 29, 1996 now abandoned, the disclosure of which is hereby incorporated by reference.

BACKGROUND OF THE INVENTION

The present invention relates to the processing of semiconductor wafers. More particularly, the present invention relates to a borophosphosilicate glass layer formed over a semiconductor substrate and an improved method and apparatus for forming the same. The present invention is particularly useful in the formation of a premetal dielectric layer but may also be applied to the formation of intermetal dielectric layers, passivation layers, and the like.

Silicon oxide is widely used as an insulating layer in the manufacture of semiconductor devices. A silicon oxide film can be deposited from a reaction of silane ($SiH_4$), tetraethylorsilicate ($Si(OC_2H_5)_4$), hereinafter referred to as "TEOS," or a similar silicon containing source with an oxygen containing source such as nitrous oxide ($N_2O$), molecular oxygen ($O_2$), ozone ($O_3$), or the like.

One particular use for a silicon oxide film is as a separation layer between the polysilicon gate/interconnect layer and the first metal layer of MOS transistors. Such separation layers are referred to as premetal dielectric (PMD) layers because they are typically deposited before any of the metal layers in a multilevel metal structure. In addition to having a low dielectric constant, low stress and good adhesion properties, it is important for PMD layers to have good stability, moisture resistance, and planarization characteristics.

When used as a PMD layer, the silicon oxide film is deposited over a lower level polysilicon gate/interconnect layer that usually contains raised or stepped surfaces. The initially deposited film generally conforms to the topography of the poly layer and is typically planarized or flattened before an overlying metal layer is deposited. A standard reflow process, in which the oxide film is heated to a temperature at which it flows, may be employed to planarize the film. Alternatively, a chemical mechanical polishing (CMP) or etching technique may be used.

Because of its low dielectric constant, low stress, good adhesion properties and relatively low reflow temperature, borophosphosilicate glass (BPSG) is one silicon oxide film that has found particular applicability in PMD layers. One known method for forming a BPSG layer uses a plasma enhanced chemical vapor deposition (PECVD) process in which phosphorus and boron containing sources are introduced into a processing chamber along with the silicon and oxygen sources normally required to form a silicon oxide layer. In this process, high frequency RF energy (13.56 MHz) is applied to a reaction zone proximate the substrate surface to promote excitation and/or disassociation of the reactant gases and thereby create a plasma of highly-reactive species. The high reactivity of the released species reduces the energy required for a chemical reaction to take place, and thus lowers the required temperature for such PECVD processes.

Semiconductor integrated circuits currently being manufactured follow ultra high density (e.g., about 0.5 to 0.35 micron) design rules and circuits manufactured in the near future will follow even smaller design rules. At such small feature sizes, issues that are important in the formation of BPSG layers include a film's ability to resist moisture absorbtion, film stability and film reflow temperature among others. The temperature at which PMD layers are reflowed is an important aspect of a process thermal budget. Temperatures above a certain level during this step can destroy shallow junctions, degrade self-aligned titanium silicide contact structures and create other problems.

One method of lowering the reflow temperature of BPSG films is to incorporate more dopant, particularly boron, into the film. Incorporating higher levels of dopants in the BPSG film using known PECVD such as the single frequency process described above, however, adversely effects the stability and the moisture resistance properties of some BPSG films. Thus, it is desirable to produce BPSG films that have a higher dopant concentration level (and thereby a reduced reflow temperature) that also are stable and have good moisture resistant properties.

Other PECVD processes apply mixed frequency RF power to generate a plasma where separate high and low frequency power supplies are used. These processes are known to be used in the deposition of undoped silicate glass (USG) layers, fluorine-doped silicate glass (FSG) layers and other films. Mixed frequency PECVD processes, however, have not been used in the deposition of BPSG films.

SUMMARY OF THE INVENTION

The present invention provides a borophosphosilicate glass (BPSG) film, and method and apparatus for forming the same, that has improved stability and moisture resistance at high dopant concentration levels and that has improved reflow properties. The BPSG film according to the present invention is formed under plasma conditions in which high and low frequency RF power is employed to generate the plasma. A high frequency power supply provides most of the energy to form the plasma and promote the necessary reactions. A low frequency power supply regulates and controls ion bombardment of the BPSG film as it is formed.

The method of the present invention includes the steps of introducing a process gas including boron, phosphorus, silicon and oxygen into a processing chamber and applying mixed radio frequency energy to the chamber to form a plasma from the process gas and deposit a BPSG film. The mixed frequency RF energy has separate high and low frequency components.

In a preferred embodiment of the method of the present invention, nitrogen is added to the process gas and the mixed frequency RF energy is supplied from separate high and low frequency power supplies. The low frequency RF power supply is used to control ion bombardment during deposition processing. Precise control of ion bombardment allows incorporation of an unexpectedly elevated amount of nitrogen into the film, which further improves film stability. In a still more preferred embodiment, the process gas includes nitrous oxide as a source of both oxygen and nitrogen.

These and other embodiments of the present invention along with many of its advantages and features are described in more detail in conjunction with the text below and attached figures.

DETAILED DESCRIPTION OF THE PREFERRED EMBODIMENTS

I. Exemplary CVD Reactor System

Figure 1:
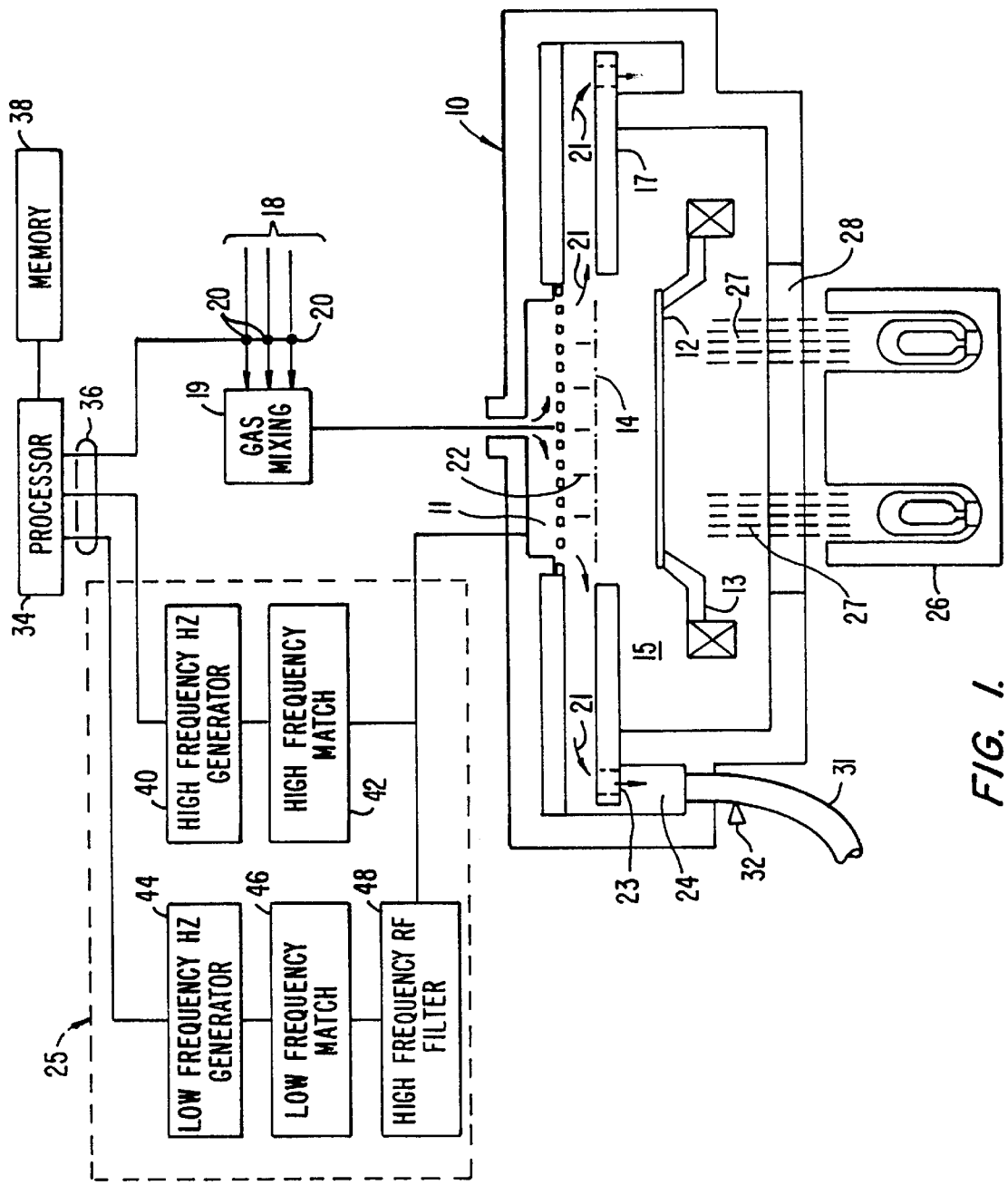
FIG. 1 is a vertical, cross-sectional view of a simplified, parallel plate chemical vapor deposition reactor in which the method of the present invention can be carried out.

The BPSG layer according to the present invention can be formed in a variety of different chemical vapor deposition (CVD) processing machines. One suitable CVD machine in which the method of the present invention can be carried out in is shown in FIG. 1, which is a vertical, cross-sectional view of a simplified, parallel plate chemical vapor deposition system 10 having a vacuum chamber 15. CVD system 10 contains a gas inlet manifold 11 for dispersing deposition gases to a wafer, not shown, that rests on a susceptor 12. Susceptor 12 is highly thermally responsive and is mounted on support fingers 13 so that susceptor 12 (and the wafer supported on the upper surface of susceptor 12) can be controllably moved between a lower loading/off-loading position and an upper processing position 14 which is closely adjacent manifold 11.

When susceptor 12 and the wafer are in processing position 14, they are surrounded by a baffle plate 17 having a plurality of spaced holes 23 which exhaust into an annular vacuum manifold 24. Deposition and carrier gases are supplied through gas lines 18 into a mixing chamber 19 where they are combined and then sent to manifold 11. The rate at which deposition and carrier gases are supplied to gas mixing chamber 19 is controlled by gas supply valves 20.

During processing, gas supplied to manifold 11 is uniformly distributed radially across the surface of the wafer as indicated by arrows 21. The gas is then exhausted via ports 23 into the circular vacuum manifold 24 and out an exhaust line 31 by a vacuum pump system (not shown). The rate at which gases are released through exhaust line 31 is controlled by a throttle valve 32.

The deposition process performed in CVD system 10 can be either a thermal process or a plasma enhanced process. In a plasma process, a controlled plasma is formed adjacent to the wafer by RF energy applied to inlet manifold 11 from RF power supply 25. Inlet manifold 11 is also an RF electrode, while susceptor 12 is grounded. RF power supply 25 provides mixed frequency RF power to manifold 11 to enhance the decomposition of reactive species introduced into chamber 15. The mixed frequency RF power is generated by a high frequency RF generator 40 and corresponding match circuit 42 and a low frequency RF generator 44 and corresponding match circuit 46. A high frequency filter 48 prevents voltage generated by high frequency generator 40 from damaging the low frequency generator.

An external lamp heater module 26 provides a collimated annular pattern of light 27 through quartz window 28 onto an annular outer peripheral portion of susceptor 12. Such heat distribution compensates for the natural heat loss pattern of the susceptor and provides rapid thermal and uniform susceptor and wafer heating for effecting deposition.

A motor, not shown, raises and lowers susceptor 12 between processing position 14 and a lower, wafer-loading position. The heater, motor, gas supply valves 20 connected to gas lines 18, throttle valve 32 and RF power supply 25 are controlled by a processor 34 over control lines 36 of which only some are shown. Processor 34 operates under the control of a computer program stored in a memory 38. The computer program includes sets of instructions that dictate the timing, mixture of gases, chamber pressure, chamber temperature, RF power levels, susceptor position, and other parameters of a particular process.

Typically, any or all of the chamber lining, gas inlet manifold faceplate, support fingers 13, and various other reactor hardware is made out of material such as aluminum or anodized aluminum. An example of such a CVD apparatus is described in U.S. Pat. No. 5,000,113 entitled "Thermal CVD/PECVD Reactor and Use for Thermal Chemical Vapor Deposition of Silicon Dioxide and In-situ Multi-step Planarized Process," issued to Chang et al. and assigned to Applied Materials, Inc., co-assignee of the present invention, which is incorporated herein by reference for all purposes.

The above CVD system description is mainly for illustrative purposes and should not be considered as limiting the scope of the present invention. Variations of the above described system such as variations platen or susceptor design, heater design, location of RF power connections and others are possible. Additionally, other CVD equipment such as inductively coupled plasma CVD devices, electron cyclotron resonance (ECR) plasma CVD devices or the like may be employed. The dielectric layer and method for forming such a layer of the present invention is not limited to any specific apparatus or to any specific plasma excitation method.

II. Formation of a BPSG Layer According to the Present Invention

The method of the present invention may be employed to decrease the reflow temperature of BPSG films deposited in a plasma-enhanced CVD reactor such as the exemplary reactor described above while maintaining or improving the moisture resistance and stability of such films. The steps involved in the formation of such a BPSG film according to the present invention are set forth in the flowchart of FIG. 2 and discussed in detail below. For convenience and reference some of the steps discussed with respect to FIG. 2 include cross-reference numerals to the apparatus of FIG. 1.

Figure 2:
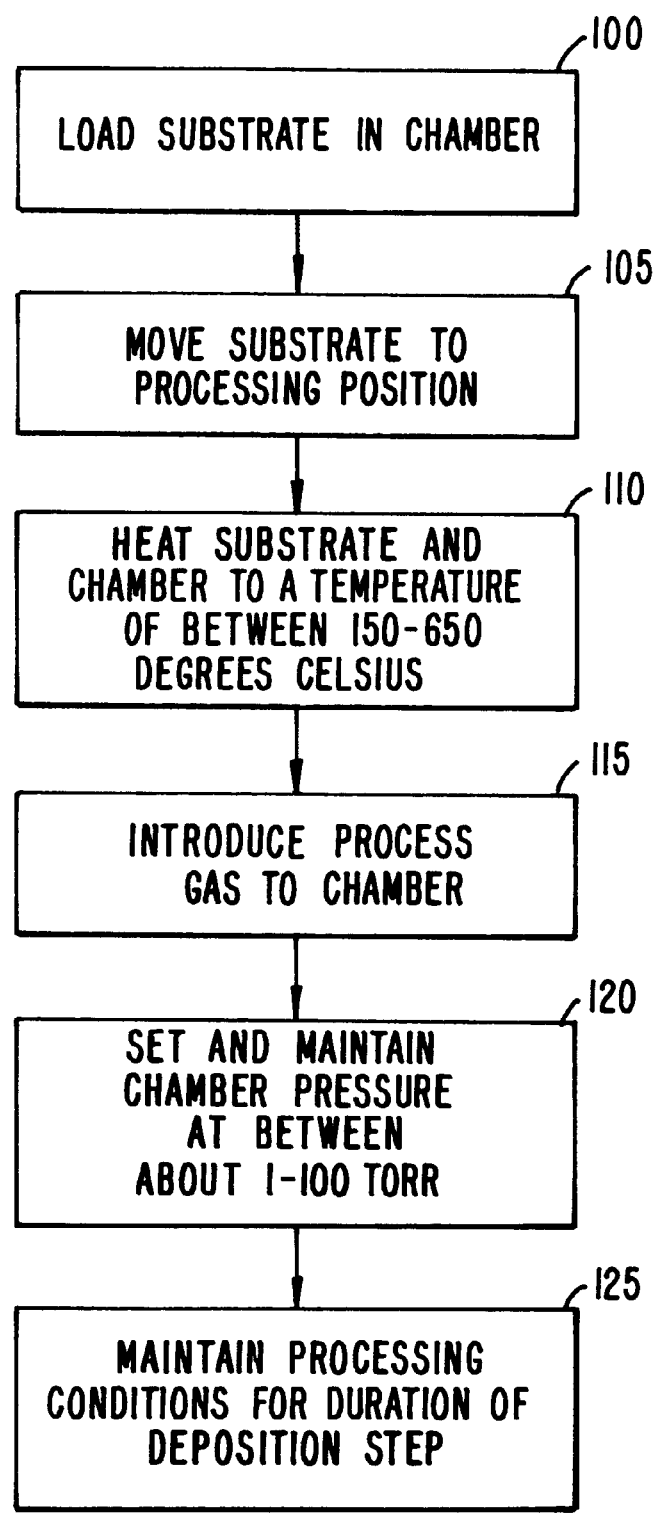
FIG. 2 is a flowchart illustrating steps undertaken in formation of a BPSG layer according to one embodiment of the method of the present invention.
Figure 3:
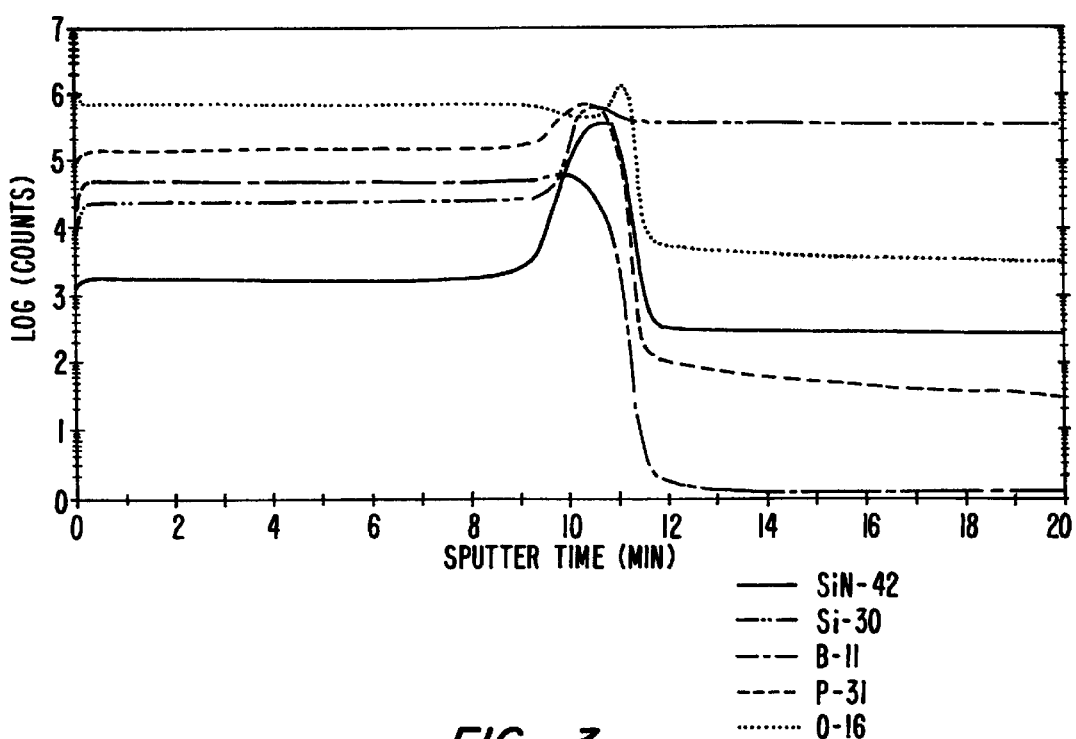
FIGS. 3, 4, 5 and 6 are graphs comparing the concentration of phosphorus, boron, silicon, oxygen and nitrogen incorporated into BPSG films deposited according to the present invention and films deposited according to prior art methods.
Figure 4:
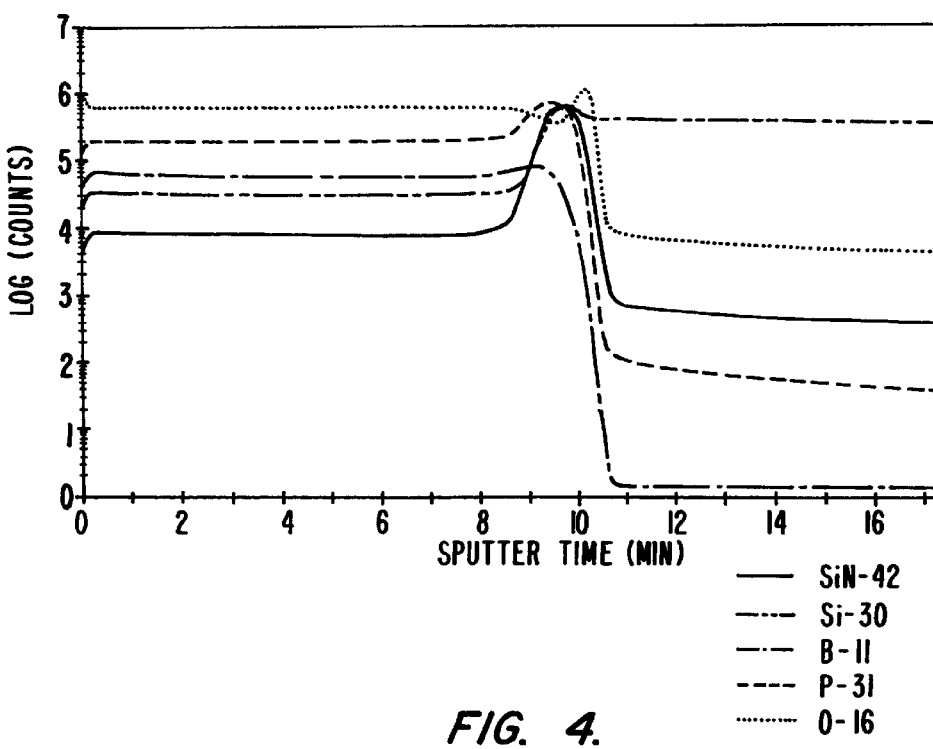

First, processor 34 controls the motor to load the wafer being processed onto susceptor 12 in vacuum chamber 15 through a vacuum-lock door and to move the wafer into processing position 14 (FIG. 2, steps 100 and 105). In processing position 14, the wafer is generally less than one centimeter from gas distribution manifold 11. Preferably, the wafer is positioned between about 150–400 mils from the gas distribution manifold. Such spacing confines the reactant gases between the wafer and manifold, increasing reaction efficiency and deposition rate, and helping confine the deposition of material to the surface of the wafer. Prior to steps 100 and 105, the wafer has typically been subjected to multiple processing steps to form active devices and other structures on the substrate surface.

Once the wafer is properly positioned, processor 34 controls heater 26 to heat the wafer and susceptor to a temperature of between about 150 and 650° C. (step 110). Preferably, the wafer and susceptor are heated to a temperature of between 350 and 500° C.

A process gas is then introduced into the chamber from manifold 11 (step 115). The process gas includes reactant gases containing phosphorus, boron, silicon and oxygen. The reactant gases are introduced through appropriate gas supply lines and mixed together in gas mixing chamber 19. The rate at which each individual reactant gas is introduced into gas mixing chamber 19 is controlled by processor 34 through gas supply valves 20 of the gas distribution system.

In a preferred embodiment, the reactant gases include a boron source such as diborine ($B_2H_6$), a phosphorus source such as phosphine ($PH_3$), a silicon source such as silane ($SiH_4$) and an oxygen source such as nitrous oxide ($N_2O$). In this preferred embodiment where the BPSG layer is deposited in a lamp heated chamber outfitted for 150 mm wafer in a P5000 system manufactured by Applied Materials, $B_2H_6$ is introduced into the chamber at a rate of between about 50–350 sccm, $PH_3$ is introduced at a rate of between about 75–450 sccm, $SiH_4$ is introduced at a rate of between about 25–200 sccm, and $N_2O$ is introduced at a rate of between about 500–2000 sccm. $N_2O$ is the preferred oxygen source because it also acts as a source of nitrogen. As described in more detail below, incorporating nitrogen into the BPSG film further improves film stability.

Other phosphorus and other boron sources and other gas flow rates may be employed. For example, triethylphosphate (TEPO), triethylphosphite (TEPi), trimethylphosphate (TMOP), trimethylphosphite ($TMP_i$) or similar compounds may be used as a phosphorus source and triethylborate (TEB), trimethylborate (TMB) or similar compounds may be used as a source of boron. Also, other silicon and oxygen sources may be used. For example, tetraethylorthosilicate (TEOS) or other organic sources may be used as the source of silicon and $O_2$ or ozone ($O_3$) may be used as the oxygen source. If $O_2$, $O_3$ or an oxygen source other than $N_2O$ is used as an oxygen source, preferably, a separate source of nitrogen such as and $N_2$ or ammonia ($NH_3$) is also introduced into the chamber so that nitrogen is incorporated into the deposited BPSG film thereby further improving film stability.

A selected pressure of between about 0.1 mtorr to 760 torr is set and maintained in the reaction chamber throughout deposition by throttle valve 32 in conjunction with the vacuum pump system and the introduction of the process gas (step 120). Throttle valve 32, the vacuum pump system and the introduction of the process gas are all controlled by processor 34 to set and maintain the selected pressure. Preferably, pressure in the chamber is set and maintained at a selected pressure of between about 1 to 20 torr, and most preferably between about 2 to 5 torr. After processing conditions are set, a plasma is formed (step 125) and maintained for a selected time period using a mixed frequency RF power supply controlled by processor 34 to deposit the BPSG thin film layer. The actual power used should be selected to achieve a desired plasma density and should be scaled according to chamber size if other chambers are employed. After deposition of the BPSG film, the wafer may be transferred to a furnace where the film is reflowed at a temperature of between about 800–900° C. for between 5–45 minutes in nitrogen and/or oxygen or a similar inert atmosphere.

The borophosphosilicate glass is a ternary oxide film including $B_2O_3$, $P_2O_5$ and $SiO_2$. The actual process for forming BPSG involves several chemical reactions of boron, phosphorus, silicon, and oxygen that form various intermediate compounds that include ions and free radicals. The byproducts of these reactions combine to form the BPSG film.

Using mixed frequency RF power to promote these chemical reactions and control the plasma is an important aspect of the present invention. A first power supply operating at between about 13 to 14 Mhz, preferably at 13.56 Mhz, is used to break the molecules of the various reactant gases thereby generating the plasma and promoting the necessary reactions. The first power supply is set to a power setting of between about 25 to 500 watts and preferably to a power level of between about 50 to 150 watts. A second power supply operating at a frequency of less than about 500 Khz is used to regulate ion bombardment on the BPSG film as the film is formed. The second power supply is set to a power setting of between about 25–500 watts. Preferably, the second power supply operates at a frequency of between about 350 to 440 Khz and is set to a power setting of between about 50 to 150 watts.

In preferred embodiments where nitrogen is included in the process gas, nitrogen is incorporated into the BPSG layer as the film is deposited. The presence of nitrogen improves the stability of the BPSG film and allows the film to incorporate a higher concentration of the boron and phosphorous dopants. Unexpectedly, experiments have found that the use of the second, low frequency power supply enhances incorporation of nitrogen into the BPSG film thereby improving the quality of the film.

In these and other experiments, characteristics of BPSG films deposited according to the method of the present invention were compared with characteristics of BPSG films deposited using a single, high frequency RF generator. Compared characteristics include film stability, film reflow properties and the ability of the film to retard moisture.

In the first set of experiments, two BPSG films containing 3 weight percent boron and 7 weight percent phosphorus were deposited. The first film was deposited using a single, high frequency RF generator. The chamber was heated to a temperature of 400 degrees Celsius and a process gas including $SiH_4$, $PH_3$, $B_2H_6$ and $N_2O$ was introduced into the chamber. $SiH_4$ was introduced at a rate of 40 sccm, $PH_3$ was introduced at a rate of 468 sccm, $B_2H_6$ was introduced at a rate of 47 sccm and $N_2O$ was introduced at a rate of 950 sccm. Pressure within the chamber was set and maintained at 2.8 torr, and a plasma was formed by application of 13.56 MHz RF energy driven at 370 Watts.

The second film was deposited according to a preferred embodiment of the method of the present invention. The chamber was heated to a temperature of 400 degrees Celsius and a process gas including $SiH_4$, $PH_3$, $B_2H_6$ and $N_2O$ was introduced into the chamber. $SiH_4$ was introduced at a rate of 47 sccm, $PH_3$ was introduced at a rate of 225 scam, $B_2H_6$ was introduced at a rate of 119 sccm and $N_2O$ was introduced at a rate of 1150 sccm. Pressure within the chamber was set and maintained at 3.0 torr, and a plasma was formed by application of 13.56 MHz RF energy driven at 90 Watts and 350 KHz RF energy driven at 68 Watts.

Secondary ion mass spectroscopy (SIMS) depth profile data was measured for each film using known techniques. Measurements were taken both before an anneal process and after an anneal as shown in FIGS. 3, 4, 5 and 6. As evident by a comparison of FIG. 3, which is SIMS data from the first film taken before an anneal step, with FIG. 4, which is SIMS data from the second film taken before an anneal step, almost an order of magnitude more nitrogen was incorporated into the BPSG film deposited according to the method of the present invention than in the film using the single, high frequency RF power source. It is believed that the manner in which the low frequency RF power source controls ion bombardment of the film helps incorporate the additional nitrogen in the film.

Figure 5:
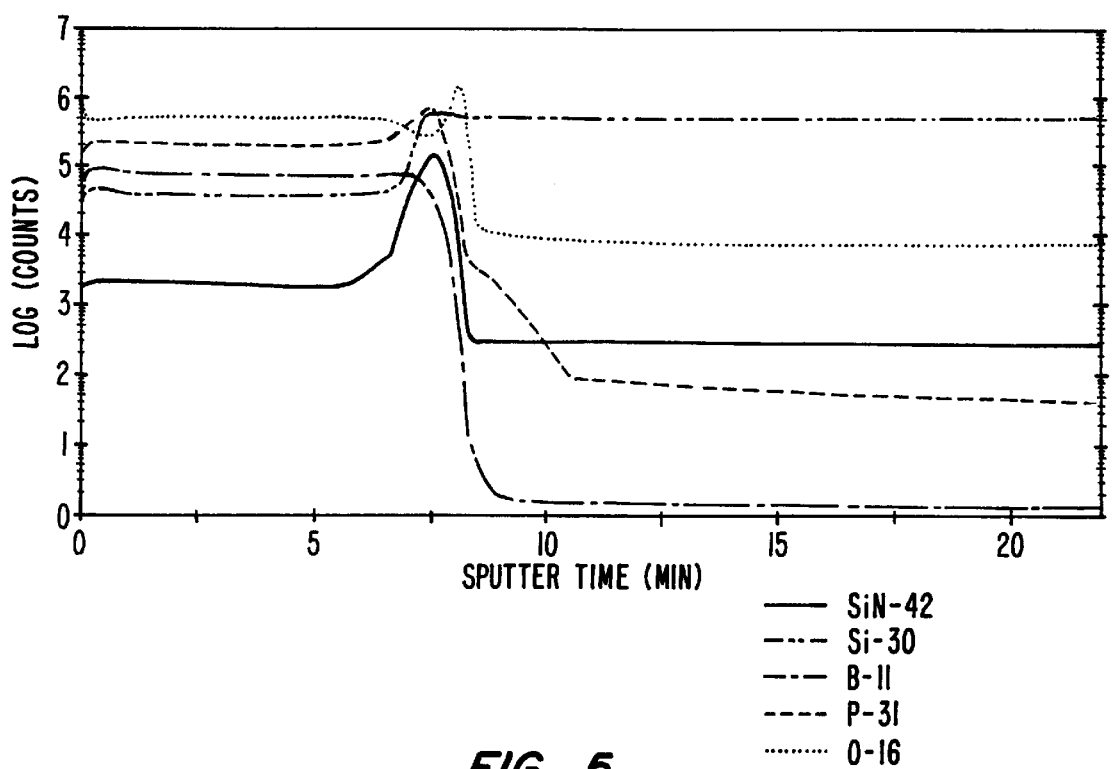
Figure 6:
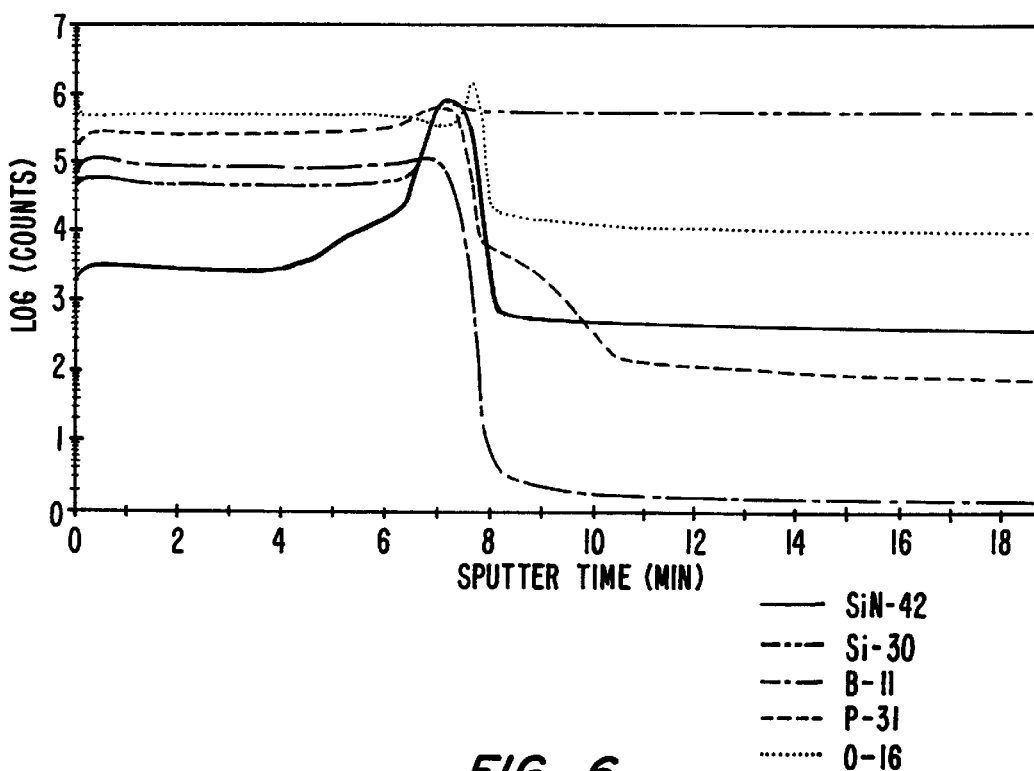

The experiments further showed that the additional nitrogen does not remain in the film after an anneal step. SIMS data taken after an anneal step for the first and second films, is shown in FIGS. 5 and 6, respectively. In the anneal step, the wafers were heated to 900 degrees Celsius in an $O_2$ environment for 10 minutes. As evident in FIGS. 5 and 6, after the anneal, the level of nitrogen in the first film is substantially equal to the level of nitrogen in the second film. The exact reasons for the change in the nitrogen level of the film deposited according to the present invention after the anneal are not completely understood. It is believed that the detector. Reference spectra were obtained from the bare silicon wafers prior to deposition and sample spectra were obtained after deposition from two samples of each of the first (samples a and b) and second (samples c and d) above-described films before an anneal step. Peaks assignable to O—H and N—H were detected in these spectra. The O—H and N—H bonded hydrogen contents were identified using the methodology of Pliskin and Landford and Rand, respectively, as known to those of skill in the art. A summary of the data from this experiment is listed below in Table 1.

TABLE 1

FTIR ANALYSIS

BPSG Film Type

| Sample | Measured Wt. % Boron | Measured Wt. % Phosphorus | PECVD Process (freq.) | Thickness (Å) | O—H Wt. % Si—OH | N—H*$10^{21}$ (atoms/cm$^3$) |
|---|---|---|---|---|---|---|
| a | 2.5 | 6.8 | Single | 4016 | 0 | 0* |
| b | 2.5 | 7.0 | Single | 4068 | 0 | 0* |
| c | 2.6 | 7.0 | Mixed | 4151 | 0 | 1.56 |
| d | 2.6 | 6.9 | Mixed | 4122 | 0 | 1.52 |

*Trace amounts of the N—H bond were detected change is desirable, however, in that an elevated nitrogen level in the BPSG film may have an undesirable effect on the reflow properties of the film. That is, it is believed that if the elevated nitrogen level remained in the BPSG film after the anneal process, the reflow temperature of the film would be increased. It is also believed that the vacancies left by the outgassing nitrogen atoms during the anneal step are filled by other atoms, thus resulting in improved reflow characteristics.

Figure 7:
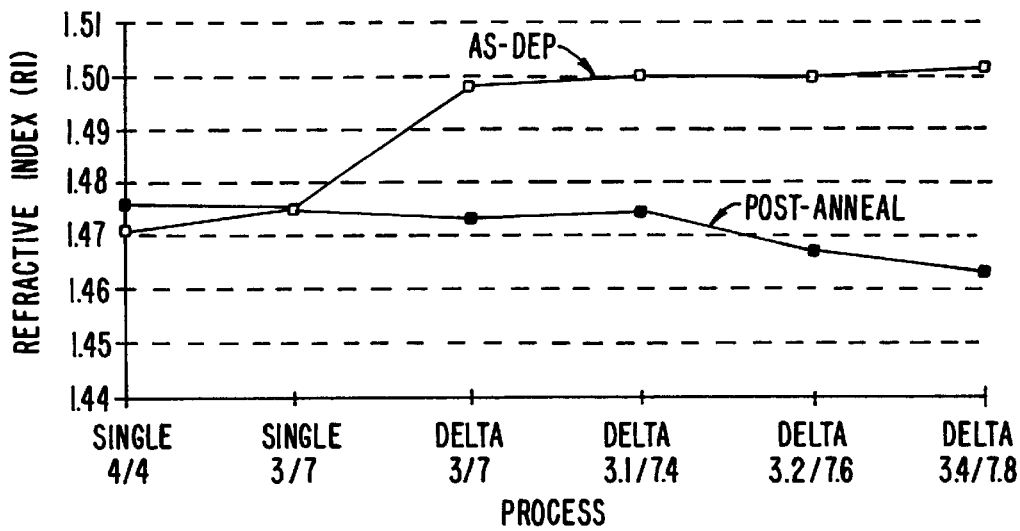
FIG. 7 is a graph comparing the refractive index of BPSG films deposited according to the present invention to the refractive index of BPSG films deposited according to prior art methods.

Further evidence of the additional nitrogen in BPSG films deposited according to the method of the present invention prior to an anneal step is shown in FIG. 7. FIG. 7 shows the refractive index of BPSG films measured with a dual wavelength ellipsometer. Measurements were taken immediately after the films are deposited and after a subsequent anneal step. The data in FIG. 7 represents measurements taken from two different BPSG films deposited using a single, high frequency RF power supply (a 4/4 boron/phosphorus wt. % film and a 3/7 boron/phosphorus wt. % film) and four different BPSG films deposited according to the method of the present invention (films having a boron/phosphorus concentration of 3/7, 3.1/7.4, 3.2/7.6 and 3.4/7.8 wt. % respectively).

The presence of nitrogen in a silicon oxide film, such as a BPSG film, generally increases the refractive index of the film. Thus, FIG. 7 provides evidence that the nitrogen content of each of the four BPSG films deposited according to the method of the present invention was higher immediately after the film was deposited than was the nitrogen content of the single frequency BPSG films. FIG. 7 also provides evidence that after the films were subjected to an anneal step the nitrogen content of these films was very similar to that of the single frequency BPSG films.

Still further evidence of the presence of additional nitrogen in BPSG films deposited according to the method of the present invention was observed by Fourier Transform Infrared Spectroscopy (FTIR) analysis using a Nicolet 800 FTIR spectrometer. Data was acquired at 4 cm$^{-1}$ resolution using an SiC silicon carbide Globar infrared source, germanium on a KBr potassium bromide beamsplitter and an MCT-B As shown in Table 1, only trace amounts of nitrogen were detected in samples a and b which were deposited using a single frequency RF source. Samples c and d, however, incorporated an amount of nitrogen on the order of $1*10^{21}$ atoms/cm$^3$.

A second set of experiments was performed to quantify the improvement in the hygroscopic nature of the film by comparing the stress in the film immediately after deposition to the stress in the films deposited 100 hours earlier. For this experiment, samples of 3 wt. % boron, 7 wt. % phosphorus BPSG films approximately 2200 Å thick were prepared according to the method of the present invention and using the above-described single, high frequency RF power technique as done in the first set of experiments. Stress measurements were taken with a Tencor 5200 in a manner well known to those of ordinary skill in the art.

Figure 8:
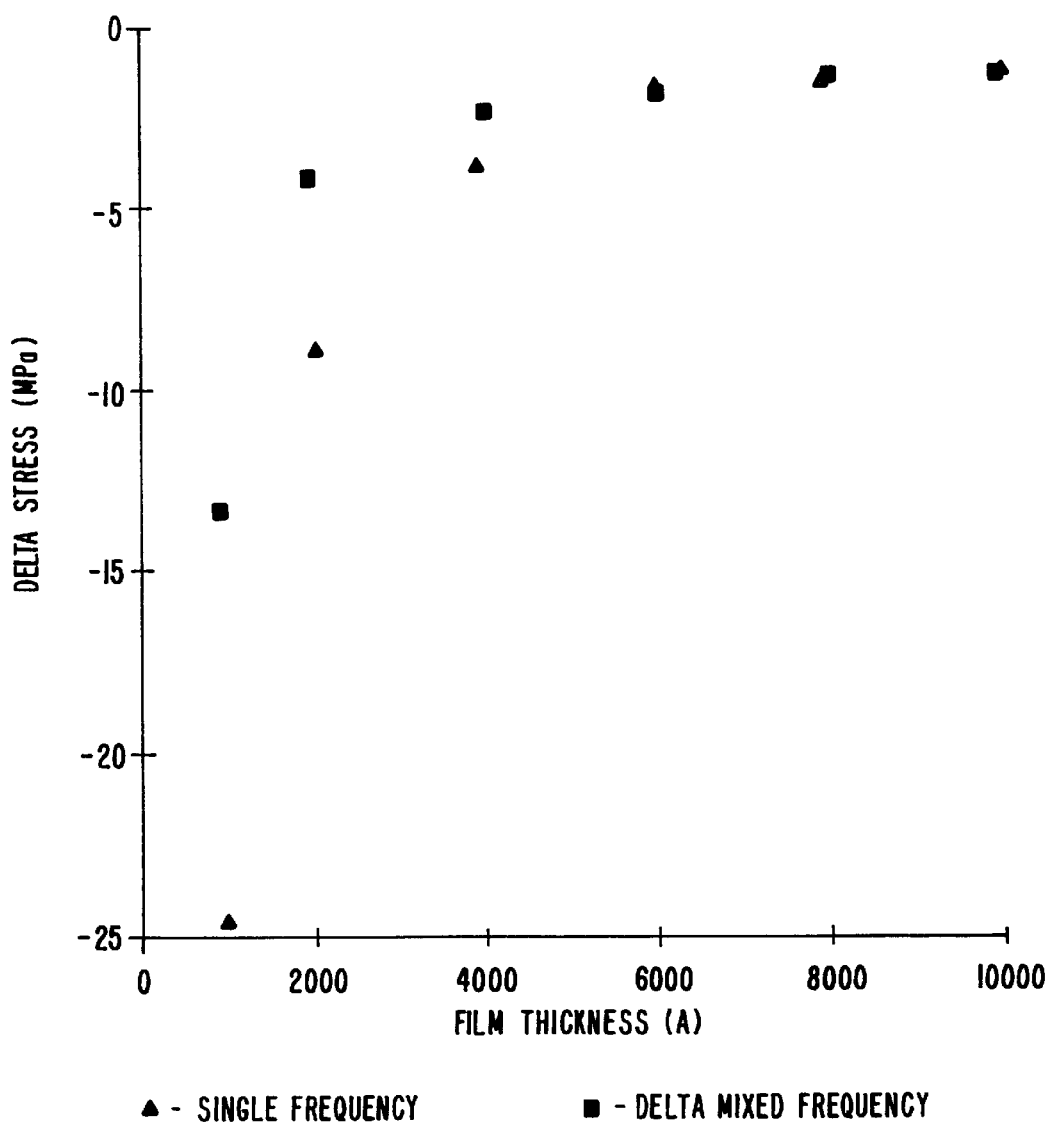
FIG. 8 is a graph comparing stress of BPSG films deposited according to the present invention to stress of BPSG films deposited according to a prior art method.

FIG. 8 shows evidence of the hydrophobic nature of a BPSG film according to the present invention. In FIG. 8, the change in film stress versus film thickness is compared for 3/7 wt. % boron/phosphorus films deposited according to the method of the present invention and deposited using a single, high frequency RF power supply. Stress measurements were taken immediately after deposition and 48 hours after the films were deposited and the difference between the measurements was plotted. As evident in FIG. 8, films deposited according to the present invention exhibited a lower stress change than single frequency films until the films reached a thickness of about 6000 Å or greater. For example, the change in stress for a 1000 Å film deposited according to the present invention was about −13 MPa as compared to a −25 MPa change in stress for the prior art film. It is believed that the lower stress of the BPSG films of the present invention is due to less moisture absorbtion in the films. It is also believed that the thicker films of the present invention would also exhibit lower stress levels than single frequency RF films of the same thickness if the films had more time in which to absorb additional moisture.

A third set of experiments was performed to quantify the stability of the film. These experiments included measuring the number of crystal defects formed. Examples of such defects include, but are not limited to BPO$_4$ crystals which are formed when the film absorbs moisture. An optical scanning tool was used to measure and compare the number of defects in BPSG films deposited according to the present invention and BPSG films deposited using a single frequency RF power supply.

First, defect measurements were taken on BPSG layers deposited according to the present invention immediately after the layers were deposited and compared to measurements taken 20 hours and 100 hours later. Measurements were taken on both unannealed and annealed films. These measurements showed that films deposited according to the present invention exhibited no appreciable increase in defects after 100 hours. Thus, the films were substantially free of crystal defects and were stable. Next, defect counts were taken on films deposited according to the present invention and compared to defect counts of a single frequency RF film. The results of these experiments were averaged and are shown below in Table 2.

invention was 50 degrees compared to a slope angle of 75 degrees for a BPSG film deposited using a single frequency RF power supply without the addition of nitrogen. This affirms that BPSG films that include the incorporation of nitrogen are better suited for use as a planarizing layer. In another set of experiments, the reflow angle of BPSG films deposited according to the present invention measured under the same conditions were decreased to 34 and 24 degrees, respectively, by increasing boron and phosphorus dopant flow rates by 10 and 20 sccm each. Further tests indicated each of these films were stable.

III. Exemplary Structure

Figure 9:
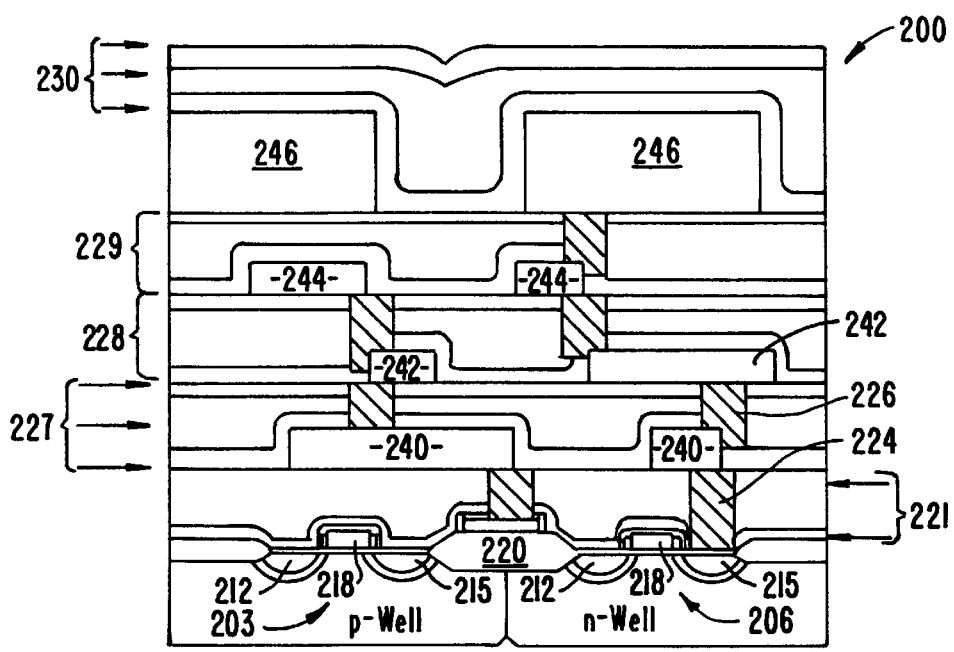
FIG. 9 is a simplified cross-sectional view of a semiconductor device manufactured according to the method of the present invention.

FIG. 9 illustrates a simplified cross-sectional view of an integrated circuit 200 according to the present invention. As shown, integrated circuit 200 includes NMOS and PMOS transistors 203 and 206. Each transistor 203 and 206 comprises a source region 212, a drain region 215 and a gate region 218. The transistors are electrically isolated from each other by field oxide region 220.

TABLE 2

Defect Counts on BPSG Film

| BPSG Film Type | | | Added Particle Count | | | | | |
|---|---|---|---|---|---|---|---|---|
| | | PECVD | | | | | | |
| Boron | Phosphorus | Process | As Deposited | | After 20 hrs | | After 100 hrs | |
| (Wt. %) | (Wt. %) | (frequency) | w/o anneal | w/anneal | w/o anneal | w/anneal | w/o anneal | w/anneal |
| 4 | 4 | single | 25 | 22 | 27 | 21 | 28 | 23 |
| 3 | 7 | single | 23 | 80 | 27 | 81 | 30 | 82 |
| 3 | 7 | mixed | 17 | 68 | 17 | 72 | 16 | 69 |
| 3.1 | 7.4 | mixed | 31 | 80 | 35 | 81 | 40 | 83 |
| 3.2 | 7.6 | mixed | 57 | 27 | 55 | 29 | 56 | 28 |
| 3.4 | 7.8 | mixed | 15 | 1 | 14 | −1 | 14 | −1 |

As evident from Table 2, fewer defects were added to a 3 percent boron, 7 percent phosphorus BPSG film deposited by the method of the present invention than to a similar film deposited using a single frequency RF power source. It is believed that the lower defect count was due to less moisture absorbtion. An additional surprising and unexpected result of the experiments summarized in Table 2 is that the defect count of the film having a boron/phosphorus concentration of 3/7 wt. % deposited according to the present invention was higher than similar films deposited using higher dopant flow rates. The 3.2/7.6 wt. % boron/phosphorus film was deposited under identical conditions as the 3/7 wt. % film except that the boron and phosphorus dopant introduction rates were increased by 10 sccm each. Similarly, the 3.4/7.8 wt. % boron/phosphorus film was deposited with 20 sccm increased flow rates. The 3.1/7.4 wt. % boron/phosphorus film was deposited using the same dopant flows as the 3/7 wt. % film, but with both the high and low frequency generators each powered at 79 Watts.

Finally, the reflow properties of BPSG films deposited according to the preferred method of the present invention were compared to those of films deposited according to the single frequency RF power process previously described. In these experiments, the films were reflowed at 900 degrees Celsius for equivalent time periods. Then, for each film, the angle formed when the layer attempts to planarize over a topographical structure (slope angle) was measured. This angle would be zero degrees if the topography of the underlying structure was completely compensated for.

In one set of the reflow property experiments, the average slope angle of films deposited according to the present A premetal dielectric layer 221 separates transistors 203 and 206 from metal layer 240 with connections between metal layer 240 and the transistors made by contacts 224. Metal layer 240 is one of four metal layers (240, 242, 244 and 246) included in integrated circuit 200. Each metal layer is separated from each other by respective intermetal dielectric layers 227, 228 or 229. Adjacent metal layers are connected at selected openings by vias 226. Deposited over metal layer M4 are planarized passivation layers 230.

While the dielectric layer of the present invention may find uses in each of the dielectric layers shown in integrated circuit 200, physical properties of the film as its low reflow temperature, low stress, good adhesion characteristics, low dielectric constant, and high deposition rate make it is most useful as an insulation layer between the substrate and metal layer 240 as shown by premetal dielectric layer 221.

It should be understood that simplified integrated circuit 200 is for illustrative purposes only. One of ordinary skill in the art would be able to implement the present method for fabrication of other integrated circuits such as microprocessors, application specific integrated circuits (ASICS), memory devices, and the like.

Having fully described several embodiments of the present invention, many other equivalent or alternative methods of depositing the low dielectric constant oxide layer according to the present invention will be apparent to those skilled in the art. These equivalents and alternatives are intended to be included within the scope of the present invention.

What is claimed is:

1. A chemical vapor deposition reactor system comprising:
   a housing that forms a vacuum chamber;
   a substrate holder, located within said housing, adapted to hold a substrate;
   a gas delivery system, configured to introduce a process gas into said vacuum chamber;
   a heater configured to heat the substrate placed on said substrate holder;
   a vacuum system configured to set and maintain a pressure level within said vacuum chamber;
   an RF power supply configured to form a plasma from said process gas, said RF power supply comprising a first, high frequency RF power generator and a second, low frequency RF power generator;
   a controller configured to control said gas delivery system, said heater, said RF power supply and said vacuum system; and
   a memory coupled to said controller and storing a program for directing operation of said chemical vapor deposition reactor system, said program including:
      instructions for controlling said heater to heat said substrate to a temperature of between about 150–650° C.;
      instructions for controlling said vacuum system to set and maintain said vacuum chamber at a pressure of between about 1–20 torr;
      instructions for controlling said gas delivery system to introduce a process gas consisting of a silicon source, an oxygen source, a boron source, a phosphorus source, and if said oxygen source does not also include nitrogen, a separate nitrogen source into said vacuum chamber; and
      instructions for driving said high frequency RF power generator at between about 25–500 Watts and for driving said low frequency RF power generator at between about 25–500 Watts to form a plasma from said process gas and deposit a borophosphosilicate glass film incorporating nitrogen atoms in addition to silicon, oxygen, boron and phosphorus atoms in the film.

2. The chemical vapor deposition reactor system of claim 1 wherein said high frequency RF power generator supplies RF power at a frequency of about 13.56 MHz and said low frequency RF power generator supplies RF power at a frequency of between about 350–440 KHz.

3. The chemical vapor deposition reactor system of claim 1 wherein said instructions that control said gas delivery system introduce nitrous oxide ($N_2O$) as said oxygen source.

4. The chemical vapor deposition reactor system of claim 3 wherein said instructions that control said gas delivery system introduce silane ($SiH_4$) as said silicon source.

5. The chemical vapor deposition reactor system of claim 4 wherein said instructions that control said gas delivery system introduce diborine ($B_2H_6$) and phosphine (PH3) as said boron and phosphorus sources, respectively.

6. The method of claim 1 wherein said borophosphosilicate glass film has a refractive index between 1.49 and 1.51 when initially deposited.

7. The method of claim 1 wherein on the order of $1\times10^{21}$ atoms/cm$^3$ of nitrogen are incorporated into said borophosphosilicate glass layer when initially deposited.

8. A substrate processing system comprising:
   a housing that forms a vacuum chamber;
   a substrate holder adapted to hold a substrate in said vacuum chamber;
   a gas delivery system configured to introduce a process gas into said vacuum chamber;
   an RF power supply configured to generate both high and low frequency RF signals;
   a controller configured to control said gas delivery system and said RF power supply; and
   a memory coupled to said controller comprising a computer-readable medium having a computer-readable program embodied therein for directing operation of said chemical vapor deposition reactor system, said computer-readable program comprising:
      instructions for controlling said gas delivery system to introduce a process gas consisting of separate sources of silicon, boron, and phosphorus and one or more sources of nitrogen and oxygen into said gas mixing chamber; and
      instructions for controlling said RF power supply system to generate said high frequency RF signal at a frequency of between about 13–14 MHz and to generate said low frequency RF signal at a frequency of less than about 500 KHz and form a plasma from said process gas to deposit a borophosphosilicate glass film incorporating nitrogen atoms in addition to boron, phosphorus, silicon and oxygen atoms in the film.

9. The chemical vapor deposition reactor system of claim 8 wherein said first set of instructions controls said gas delivery system to introduce silane ($SiH_4$) as said silicon source.

10. The chemical vapor deposition reactor system of claim 8 further comprising:
    a temperature control system configured to maintain a selected temperature within said vacuum chamber;
    a pressure control system configured to maintain a selected pressure within said vacuum system; and
    wherein said controller further controls said temperature control system and said pressure control system; and
    wherein said memory further comprises:
       instructions for controlling said heater to heat said chamber to a temperature of between about 150–650° C.; and
       instructions for controlling said vacuum system to set and maintain said vacuum chamber at a pressure of between about 1–20 torr.

11. The method of claim 8 wherein said borophosphosilicate glass film has a refractive index between 1.49 and 1.51 when initially deposited.

12. The method of claim 8 wherein on the order of $1\times10^{21}$ atoms/cm$^3$ of nitrogen are incorporated into said borophosphosilicate glass layer when initially deposited.

13. A substrate processing system comprising:
    a housing that forms a vacuum chamber;
    a substrate holder adapted to hold a substrate in said vacuum chamber;
    a gas delivery system configured to introduce a process gas into said vacuum chamber;
    an RF power supply configured to generate both high and low frequency RF signals;
    a controller configured to control said gas delivery system and said RE power supply; and
    a memory coupled to said controller comprising a computer-readable medium having a computer-readable program embodied therein for directing operation of said chemical vapor deposition reactor system, said computer-readable program comprising:

instructions for controlling said gas delivery system to introduce a process gas consisting of a silicon source, nitrous oxide, a boron source and a phosphorus source into said gas mixing chamber; and instructions for controlling said RF power supply system to generate a plasma from said process gas using both said high and low frequency RF signals to deposit a borophosphosilicate glass film incorporating nitrogen atoms in addition to boron, phosphorus, silicon and oxygen atoms in the film.

14. The method of claim 13 wherein said borophosphosilicate glass film has a refractive index between 1.49 and 1.51 when initially deposited.

15. The method of claim 13 wherein on the order of $1 \times 10^{21}$ atoms/cm$^3$ of nitrogen are incorporated into said borophosphosilicate glass layer when initially deposited.

16. The method of claim 13 wherein said silicon source is silane.

17. A substrate processing system comprising:
a housing that forms a vacuum chamber;
a substrate holder adapted to hold a substrate in said vacuum chamber;
a gas delivery system configured to introduce a process gas into said vacuum chamber;
an RF power supply configured to generate both high and low frequency RF signals;
a controller configured to control said gas delivery system and said RF power supply; and
a memory coupled to said controller comprising a computer-readable medium having a computer-readable program embodied therein for directing operation of said chemical vapor deposition reactor system, said computer-readable program comprising:

instructions for controlling said gas delivery system to introduce a process gas consisting of a silicon source, an oxygen source, a boron source, a phosphorus source and a nitrogen source into said gas mixing chamber; and instructions for controlling said RF power supply system to generate a plasma from said process gas using both said high and low frequency RF signals to deposit a borophosphosilicate glass film incorporating nitrogen atoms in addition to boron, phosphorus, silicon and oxygen atoms in the film.

18. The method of claim 17 wherein said borophosphosilicate glass film has a refractive index between 1.49 and 1.51 when initially deposited.

19. The method of claim 17 wherein on the order of $1 \times 10^{21}$ atoms/cm$^3$ of nitrogen are incorporated into said borophosphosilicate glass layer when initially deposited.

20. The method of claim 18 wherein said silicon source is silane.

* * * * *